United States Patent
Chen et al.

(10) Patent No.: US 10,930,600 B2
(45) Date of Patent: Feb. 23, 2021

(54) DISPLAY SUBSTRATE, METHOD OF MANUFACTURING DISPLAY SUBSTRATE, AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Weixiong Chen, Beijing (CN); Bin Li, Beijing (CN); Xin Li, Beijing (CN); Huiying Li, Beijing (CN); Yong Song, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/323,450

(22) PCT Filed: May 3, 2018

(86) PCT No.: PCT/CN2018/085438
§ 371 (c)(1),
(2) Date: Feb. 5, 2019

(87) PCT Pub. No.: WO2018/210133
PCT Pub. Date: Nov. 22, 2018

(65) Prior Publication Data
US 2019/0172797 A1    Jun. 6, 2019

(30) Foreign Application Priority Data

May 17, 2017 (CN) .......................... 201710349518.X

(51) Int. Cl.
*H01L 23/00* (2006.01)
*H01L 21/02* (2006.01)
*H01L 27/12* (2006.01)

(52) U.S. Cl.
CPC .......... *H01L 23/562* (2013.01); *H01L 21/022* (2013.01); *H01L 21/02203* (2013.01); *H01L 23/564* (2013.01); *H01L 27/1248* (2013.01)

(58) Field of Classification Search
CPC . H01L 21/022; H01L 23/562; H01L 27/1248; H01L 21/02203; H01L 23/564
See application file for complete search history.

(56) References Cited

U.S. PATENT DOCUMENTS

| | | |
|---|---|---|
| 2005/0142349 A1 | 6/2005 | Irwin et al. |
| 2007/0117911 A1 | 5/2007 | Irwin et al. |
| | (Continued) | |

FOREIGN PATENT DOCUMENTS

| | | |
|---|---|---|
| CN | 1992100 A | 7/2007 |
| CN | 101689456 A | 3/2010 |
| | (Continued) | |

OTHER PUBLICATIONS

First Office Action with English language translation, CN Application No. 201710349518.X, dated Mar. 21, 2019, 12 pp.
(Continued)

*Primary Examiner* — Thanh T Nguyen
(74) *Attorney, Agent, or Firm* — Myers Bigel, P.A.

(57) ABSTRACT

There is provided a display substrate, a method of manufacturing a display substrate, and a display device. The display substrate includes a base substrate, a conductive layer on the base substrate, and a protective layer on the conductive layer. The protective layer includes a plurality of (Continued)

fillers disposed in one layer. The filler includes an outer wall and a plurality of nanoscale filling particles enclosed by the outer wall.

8 Claims, 2 Drawing Sheets

(56) References Cited

U.S. PATENT DOCUMENTS

| | | |
|---|---|---|
| 2010/0171420 A1 | 7/2010 | Akiyama et al. |
| 2016/0178941 A1* | 6/2016 | Kim .................... G02F 1/1334 349/86 |
| 2017/0062763 A1* | 3/2017 | Oh ...................... H01L 27/3244 |
| 2019/0172797 A1 | 6/2019 | Chen et al. |

FOREIGN PATENT DOCUMENTS

| | | |
|---|---|---|
| CN | 102643402 A | 8/2012 |
| CN | 106486519 A | 3/2017 |
| CN | 106941105 A | 7/2017 |
| JP | 2001237523 A | 8/2001 |

OTHER PUBLICATIONS

Second Office Action with English language translation, CN Application No. 201710349518.X, dated May 17, 2019, 10 pp.
International Search Report and Written Opinion of the International Searching Authority (with English language translation of Written Opinion), International Application No. PCT/CN2018/085438, dated Aug. 7, 2018, 11 pp.

* cited by examiner

DISPLAY SUBSTRATE, METHOD OF MANUFACTURING DISPLAY SUBSTRATE, AND DISPLAY DEVICE

CROSS REFERENCE TO RELATED APPLICATIONS

The present application is a 35 U.S.C. 371 national stage application of PCT International Application No. PCT/CN2018/085438, filed on May 3, 2018, which claims the benefit of Chinese Patent Application No. 201710349518.X, filed on May 17, 2017, the contents of which are incorporated herein by reference in their entireties. The above-referenced PCT International Application was published in the Chinese language as International Publication No. WO 2018/210133 A1 on Nov. 22, 2018.

TECHNICAL FIELD

The present disclosure relates to a display substrate, a method of manufacturing a display substrate, and a display device.

BACKGROUND

During the manufacturing process and subsequent use of display panels, micro-cracks may be created easily on the protective layer of the display panel. The micro-cracks may allow corrosive gases or liquids to enter the display panel through them, such that the film layers and metal wiring of the display panel are damaged.

SUMMARY

According to an aspect of the present disclosure, there is provided a display substrate. The display substrate comprises a base substrate, a conductive layer on the base substrate, and a protective layer on the conductive layer. The protective layer comprises a plurality of fillers disposed in one layer. The filler comprises an outer wall and a plurality of nanoscale filling particles enclosed by the outer wall.

In some embodiments, the fillers are at a side of the protective layer away from the base substrate.

In some embodiments, the fillers are inside the protective layer.

In some embodiments, the protective layer comprises a passivation layer.

In some embodiments, the protective layer comprises an insulating layer.

In some embodiments, the outer wall comprises a polyurea material.

In some embodiments, the filling particle comprises mesoporous silica loaded with silicon nitride nanoparticles.

According to another aspect of the present disclosure, there is provided a display device comprising the display substrate according to any of the embodiments of the present disclosure.

According to yet another aspect of the present disclosure, there is provided a method for manufacturing a display substrate, comprising:—forming a conductive layer pattern on a base substrate, and—forming a protective layer pattern comprising a plurality of fillers disposed in one layer on the conductive layer pattern. The filler comprises an outer wall and a plurality of nanoscale filling particles enclosed by the outer wall.

In some embodiments, the step of forming the protective layer pattern comprising the plurality of fillers disposed in one layer on the conductive layer pattern comprises:—forming a first protective layer thin film on the conductive layer pattern;—coating the first protective layer thin film with a mixed solution comprising the fillers;—baking the base substrate coated with the mixed solution to volatilize a solvent in the mixed solution and form a filler layer on the first protective layer thin film; and,—etching the first protective layer thin film and the filler layer to form the protective layer pattern comprising the plurality of fillers disposed in one layer.

In some embodiments, the step of forming the protective layer pattern comprising the plurality of fillers disposed in one layer on the conductive layer pattern comprises:—forming a first protective layer thin film on the conductive layer pattern;—coating the first protective layer thin film with a mixed solution comprising the fillers;—baking the base substrate coated with the mixed solution to volatilize a solvent in the mixed solution and form a filler layer on the first protective layer thin film;—forming a second protective layer thin film on the filler layer; and—etching the first protective layer thin film, the second protective layer thin film and the filler layer to form the protective layer pattern comprising the plurality of fillers disposed in one layer.

In some embodiments, a material of the solvent comprises cyclohexane. In some embodiments, a percentage of mass of the fillers in the mixed solution is 50%-70%.

It should be understood by those skilled in the art that these drawings do not show all of the elements contained in the display substrate of embodiments of the present disclosure. Some elements have been omitted for the sake of clarity and simplicity.

DETAILED DESCRIPTION

The technical solutions in the embodiments of the present disclosure will be described below in conjunction with the drawings in the embodiments of the present disclosure. Apparently, the described embodiments are only a part of the embodiments of the present application, and not all of the embodiments. All of other embodiments obtained by a person of ordinary skill in the art based on the embodiments of the present disclosure without creative efforts are within the protection scope of the present disclosure.

It should be understood that the drawings are not drawn to scale, and are only used to schematically illustrate the content of the present disclosure.

During the manufacturing process and subsequent use of the display panel, the display panel is easy to collide with foreign objects or fall, or stress is easy to be generated in a relatively harsh environment (for example, high temperature and/or high humidity). This may causes micro-cracks on the protective layer, thereby causes corrosive gases or liquids to enter into the display panel through the micro-cracks. Once exposed to corrosive gases or liquids, the film layers and metal wiring inside the display panel may be damaged, thereby causing problems to the display function of the screen. Moreover, the micro-cracks of the protective layer are sometimes difficult to be found during the preliminary inspection.

The display substrates according to the embodiments of the present disclosure are applicable to OLED (Organic Light-Emitting Diode) display substrates and LCD (Liquid Crystal Display) display substrates and various other display modules. The protective layer of the display substrate includes a plurality of fillers disposed in one layer. When micro-cracks are generated in the protective layer, the outer wall(s) of the filler(s) at the locations of the micro-cracks are also broken, so that the nanoscale filling particles inside the filler(s) can automatically fill the micro-cracks. This can prevent corrosive gases or liquids from entering into the display panel through the micro-cracks and damaging the film layers and the metal wirings therein, thereby improving the yield of the display substrates.

In the embodiments of the present disclosure, the term "conductive layer pattern" may be understood as a patterned conductive layer, and the term "protective layer pattern" may be understood as a patterned protective layer.

The display substrate, the method of manufacturing the display substrate, and the display device provided by the embodiments of the present disclosure will be respectively described in detail below.

Figure 1:
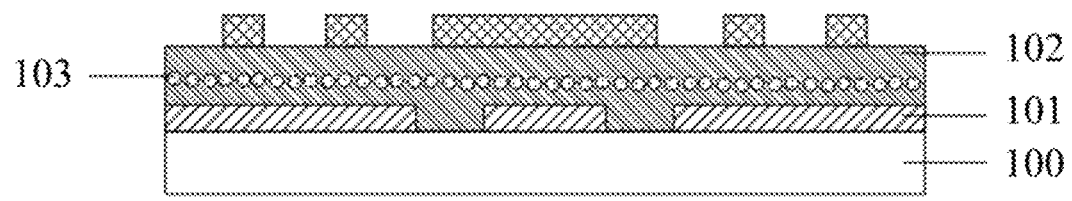
FIG. 1 schematically shows a cross-sectional structure of a display substrate according to an embodiment of the present disclosure.
Figure 2:
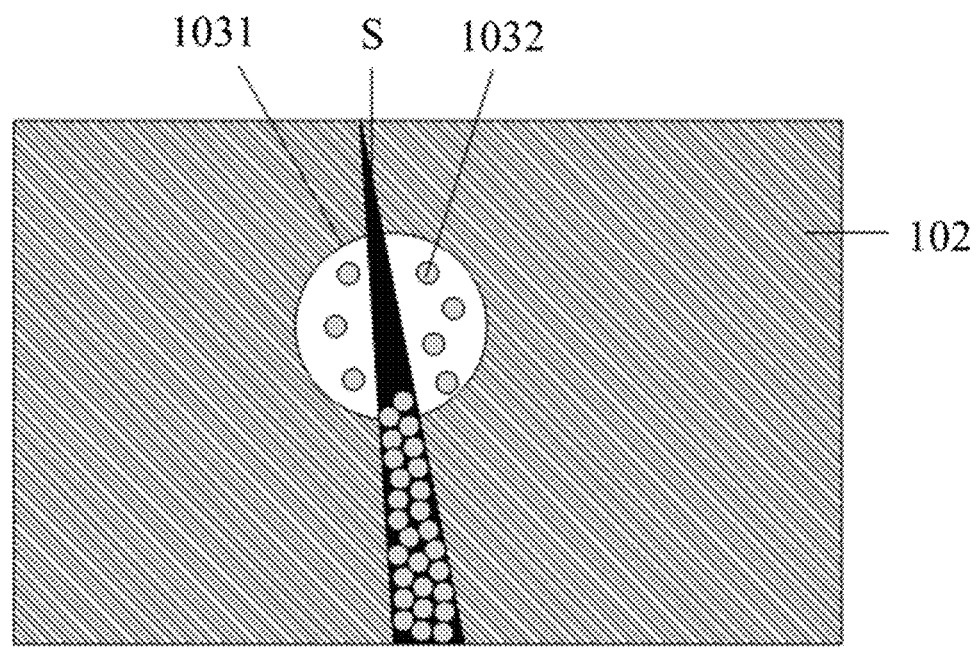
FIG. 2 schematically shows a structure of a protective layer according to an embodiment of the present disclosure when a crack is generated.

FIG. 1 schematically shows a cross-sectional structure of the display substrate according to an embodiment of the present disclosure. FIG. 2 schematically shows a structure of the protective layer when a crack is generated according to an embodiment of the present disclosure. The display substrate comprises a base substrate 100, a conductive layer 101 on the base substrate 100, and a protective layer 102 on the conductive layer 101. The protective layer 102 comprises a plurality of fillers 103 disposed in one layer. The filler 103 comprises an outer wall 1031 and a plurality of nanoscale filling particles 1032 enclosed by the outer wall.

In some embodiments, among the fillers 103 of the protective layer 102, at least a portion of the fillers 103 is located in one layer and evenly distributed. The orthographic projection of the outer contour of the layer of fillers 103 on the base substrate surrounds the orthographic projection of the conductive layer (pattern) on the base substrate.

The protective layer 102 may be a passivation layer or an insulating layer, and may be specifically selected as needed.

As shown in FIG. 2, since the protective layer 102 comprises a plurality of fillers 103 comprising nanoscale filling particles 1032, when a micro-crack S is generated in the protective layer 102, the outer wall 1031 of the filler 103 at the location of the micro-crack S is also broken accordingly. Subsequently, the nanoscale filling particles 1032 can be drained from the filler 103 and move to the location of the micro-crack S to fill the micro-crack S.

The display substrate of the embodiments of the present disclosure ensures that the conductive layer 101 is always covered by the protective layer 102 and would not being exposed in the external environment, so that corrosive gases or liquids cannot enter into the display substrate through the micro-crack S and damage the conductive layer 101, thereby improving the yield of the display substrate.

The location of the filler can be determined as needed. In some embodiments, the filler can be located inside the protective layer. In some embodiments, the filler may be located at the surface layer of the protective layer. For example, the filler may be located on a side of the protective layer away from the base substrate.

The location of the filler is related to the material and manufacturing process of the protective layer. The protective layer may be an insulating layer or a passivation layer. When the protective layer is a passivation layer, in some embodiments, a PECVD (Plasma Enhanced Chemical Vapor Deposition) process may be employed to generate $SiN_x$ by a chemical reaction to form the passivation layer. Then, the filler may be formed by a solution method on the side of the protective layer away from the base substrate. In some embodiments, a layer of passivation layer can firstly be deposited by employing the PECVD process. A layer of fillers is then formed on the passivation layer (by the solution method). Then, another passivation layer is fabricated on the filler layer. By doing so, the filler is located inside the protective layer 102.

The specific type of the above-mentioned filler may be selected as needed, as long as it comprises an outer wall and the outer wall encloses the nanoscale filling particles for filling the micro-cracks. In some embodiments, the filler has a diameter of 50 μm-200 μm. The diameter of the nanoscale filling particle is not larger than 100 nm. In some embodiments, the diameter of the nanoscale filling particle is no more than 50 nm.

The material of the outer wall of the filler and the filling particle can be selected according to the actual needs. In some embodiments, the outer wall of the filler comprises a polyurea material. In some embodiments, the filling particle of the filler comprises mesoporous silica loaded with silicon nitride nanoparticles.

In some embodiments, the above-mentioned mesoporous silica loaded with silicon nitride nanoparticle can be produced by a microemulsion polymerization method, comprising the following steps:

adding CTAB (Cetyl Trimethyl Ammonium Bromide) or DTAB (Dodecyl Trimethyl Ammonium Bromide), $MgSO_4$ (Magnesium Sulfate), $SiN_x$ (Silicon Nitride) to the deionized water and performing ultrasonic dispersion;

using sodium dodecyl benzene sulfonate as an emulsifier, adding TEOS (tetraethyl orthosilicate) and performing the reaction; and after the reaction ends, using the absolute ethyl alcohol for demulsification, and then drying to obtain the mesoporous silica loaded with the silicon nitride nanoparticles.

In some embodiments, after the mesoporous silica loaded with the silicon nitride nanoparticles is produced, the filler can be produced by an inverse miniemulsion method which specifically comprising the following steps:

adding a diamine monomer mixture (EDA ethylene diamine and AIBN azobisisobutyronitrile), NaCl (sodium chloride), and the previously prepared mesoporous silica loaded with silicon nitride nanoparticles to deionized water, and performing ultrasonic dispersion;

using sodium dodecyl benzene sulfonate as an emulsifier and KPS (potassium persulfate) as an initiator, pre-emulsifying the dispersion obtained in the previous step to obtain a mixed solution; and slowly dripping a cyclohexane solution containing TDI (toluene diisocyanate) to the mixed solution, and washing after the end of the reaction, to obtain the polyurea microspheres (i.e., the filler in the embodiment of the present disclosure) enclosing the silicon nitride nanoparticles.

The above-mentioned producing process is only a schematic description, and those of ordinary skill in the art can select a suitable amount of reaction raw materials, reaction conditions and reaction time according to the provided producing technics in combination with the corresponding chemical reactions. For example, the reaction time may be 12 hours, 24 hours, or other desired reaction time. The reaction temperature may be room temperature (e.g., 20-30° C.) or other temperature which is advantageous for accelerating the reaction. The emulsification time may be 1 hour or other feasible time. The drying method may be ventilatory drying at room temperature, heated drying at 30-50° C., or the like.

Of course, the above-mentioned process of producing fillers is only used to explain and illustrate how the fillers can be prepared, and is not intended to limit the method for producing the filler according to the present disclosure.

In some embodiments, the used filler may be filling microsphere which is easy to manufacture and more stable. However, it is easy for those of ordinary skill in the art to recognize that, the filler can be processed into a variety of desired shapes, such as cuboid, ellipsoid, etc., based on common processing techniques.

There is also provided a display device according to the embodiments of the present disclosure. The display device comprises the display substrate according to any of the embodiments of the present disclosure.

There is also provided a method for manufacturing a display substrate according to the embodiments of the present disclosure.

Figure 3:
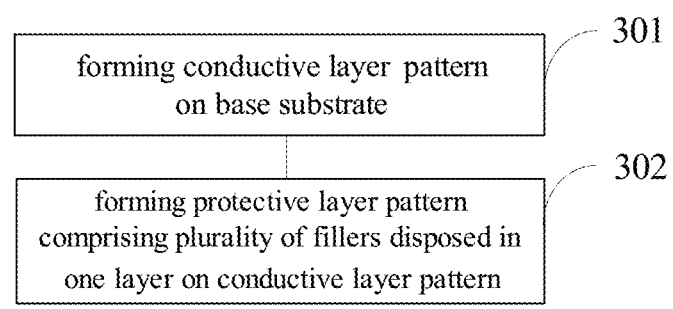
FIG. 3 schematically shows a flow chart of a method for manufacturing a display substrate according to an embodiment of the present disclosure.

FIG. 3 schematically shows a flow chart of the method for manufacturing the display substrate according to an embodiment of the present disclosure. The method for manufacturing the display substrate specifically comprises the following steps:

forming a conductive layer pattern on a base substrate (step 301), and forming a protective layer pattern on the conductive layer pattern, wherein the protective layer comprises a plurality of fillers disposed in one layer (step 302). The filler comprises an outer wall and a plurality of nanoscale filling particles enclosed by the outer wall.

In some embodiments, the step of forming the conductive layer pattern on the base substrate can utilize conventional techniques. A protective layer pattern is fabricated after the conductive layer pattern is formed. During the manufacturing process the protective layer pattern, the plurality of fillers is formed in the protective layer in a single fabrication process. The method for forming the protective layer pattern comprising fillers will be specifically described below.

Figure 4:
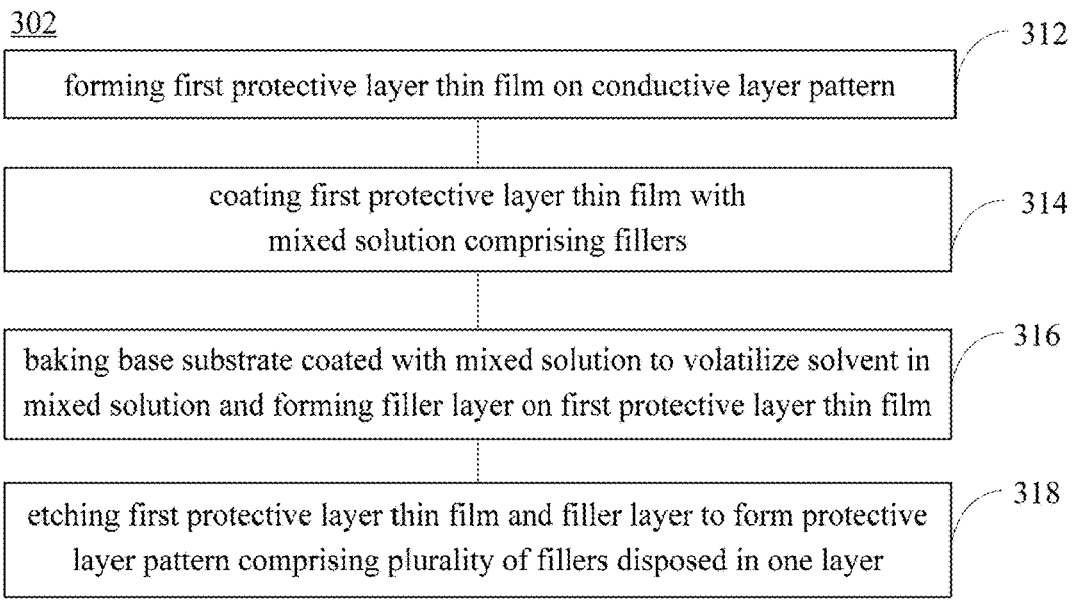
FIG. 4 schematically shows another flow chart of a method for manufacturing a display substrate according to an embodiment of the present disclosure.

FIG. 4 schematically shows another flow chart of the method for manufacturing the display substrate according to an embodiment of the present disclosure. Specifically, FIG. 4 schematically shows a flow chart of a set of sub-steps comprised by the step of forming a protective layer pattern comprising a plurality of fillers disposed in one layer on a conductive layer pattern (step 302). This set of sub-steps specifically comprises:

forming a first protective layer thin film on the conductive layer pattern (step 312), coating the first protective layer thin film with the mixed solution containing the filler (step 314), baking the base substrate coated with the mixed solution to volatilize the solvent in the mixed solution and form a filler layer on the first protective layer thin film (step 316), and etching the first protective layer thin film and the filler layer to form a protective layer pattern comprising a plurality of fillers disposed in one layer (step 318).

In some embodiments, step 318 can be conducted by implementing a patterning process.

After the conductive layer pattern is formed, form a protective layer on the conductive layer pattern. Firstly, formed a whole layer of first protective layer thin film on the conductive layer pattern (step 312). Then, coat the mixed solution containing the filler on the first protective layer thin film, with the first protective layer thin film not patterned (step 314). The mixed solution is the fillers dissolved in the solvent. The material of the above-mentioned solvent can be selected as needed, as long as it can be used to dissolve the filler. In order to prevent the solvent from affecting the protective layer thin film, in some embodiments, the material of the solvent is one or more of cyclohexane and other organic solvents.

Generally, the filler is sealed and stored in a reagent bottle at low temperature in the form of solid powder before being used. When used, the filler is dissolved in the solvent according to a certain percentage of mass, for later use. In some embodiments, the percentage of mass of the filler in the mixed solution is 50%-70%.

After coating with the mixed solution, it is necessary to remove the solvent to fix the filler to the protective layer thin film. Thus, the base substrate coated with the mixed solution is baked to volatilize the solvent in the mixed solution and a filler layer is formed on the first protective layer thin film (step 316). Of course, other processes may also be employed as needed to remove the solvent from the mixed solution.

After the solvent is removed, the fillers are fixed to the first protective layer thin film due to the baking. Thereafter, a patterning process can be done to the baked first protective layer thin film and filler layer directly, i.e., etching the first protective layer thin film and the filler layer by a patterning process, to form the protective layer pattern comprising a plurality of fillers disposed in one layer (step 318). At this moment, the formed protective layer pattern includes fillers. When micro-cracks are generated on the protective layer, the outer wall of the filler at the micro-cracks may be broken with the generation of cracks. The nanoscale filling particles inside the filler can automatically fill the cracks, thereby protecting the conductive layer in the display substrate, and thus improving the yield of the display substrate.

Figure 5:
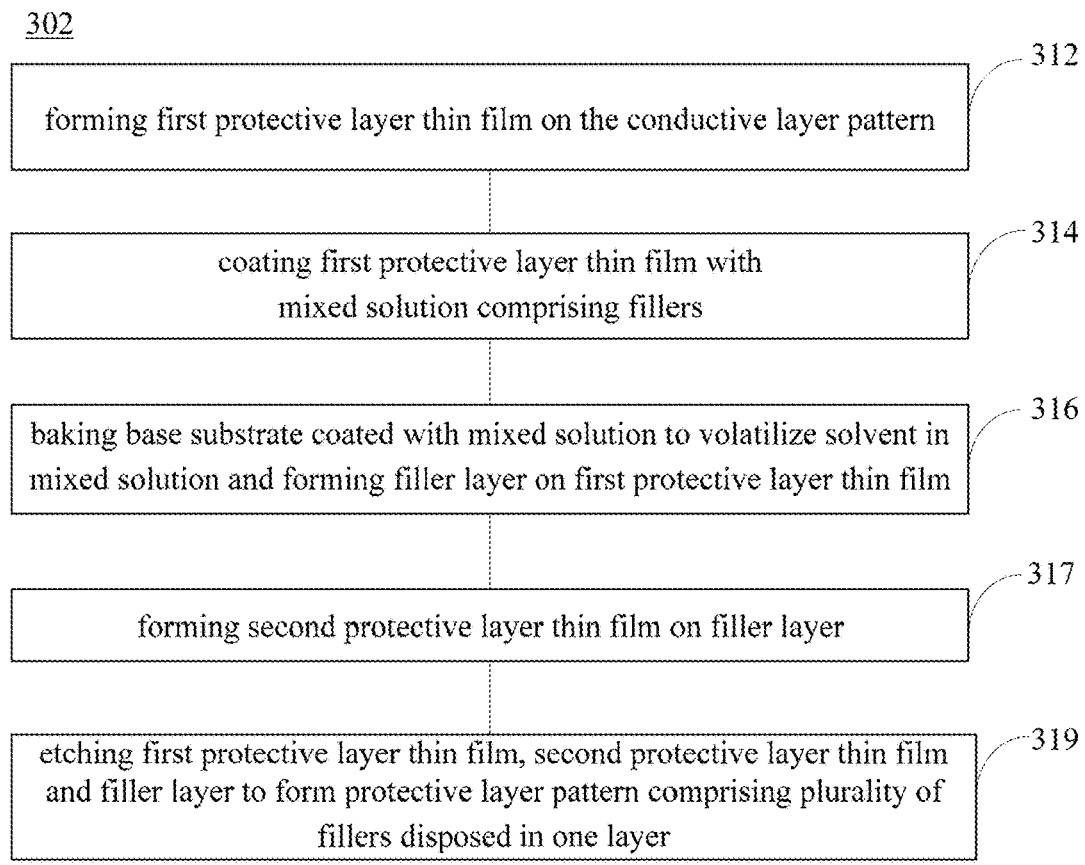
FIG. 5 schematically shows yet another flow chart of a method for manufacturing a display substrate according to an embodiment of the present disclosure.

FIG. 5 schematically shows yet another flow chart of the method for manufacturing the display substrate according to an embodiment of the present disclosure. Specifically, FIG. 5 schematically shows the flow chart of another set of sub-steps comprised by step 302. In that set of sub-steps, in order for the fillers to provide a better protection, another layer of protective layer thin film can be fabricated on the fillers. Specifically, that set of sub-steps comprises:

forming a first protective layer thin film on the conductive layer pattern (step 312), coating the mixed solution comprising the fillers on the first protective layer thin film (step 314), baking the base substrate coated with the mixed solution to volatilize the solvent in the mixed solution and form a filler layer on the first protective layer thin film (step 316), forming a second protective layer thin film on the filler layer (step 317), and etching the first protective layer thin film, the second protective layer thin film and the filler layer to form the protective layer pattern comprising a plurality of fillers disposed in one layer (step 319).

In some embodiments, similar to step 318 in the previous set of sub-steps, step 319 can be conducted by implementing a patterning process.

By forming the second protective layer thin film on the filler layer, the fillers are inside the protective layer pattern, so that the protective effect of the fillers is enhanced.

In summary, according to the embodiments of the present disclosure, there is provided a display substrate comprising a base substrate, a conductive layer on the base substrate, and a protective layer on the conductive layer. The protective layer comprises a plurality of fillers disposed in one layer. The filler comprises an outer wall and a plurality of nanoscale filling particles enclosed by the outer wall. According to the embodiments of the present disclosure, there is also provided a display device comprising the display substrate according to any of the embodiments of the present disclosure. According to the embodiments of the present disclosure, there is also provided a method for manufacturing a display substrate.

When micro-cracks are generated on the protective layer, the outer wall of the filler at the micro-cracks may be broken along with the generation of the micro-cracks. The nanoscale filling particles inside the filler can automatically fill the cracks, and in turn can prevent corrosive gases or liquids from entering in the display substrate through the micro-cracks and damaging the conductive layer, which improves the yield of the display substrate.

Apparently, various modifications and variations of the present disclosure can be made by those skilled in the art without departing from the spirit and scope of the disclosure. Thus, it is intended that the present disclosure also covers these modifications and variations as long as these modifications and variations of the present disclosure are within the scope of the appended claims of the present disclosure and their equivalents.

What is claimed is:

1. A display substrate comprising:
   a base substrate,
   a conductive layer on the base substrate, and
   a protective layer on the conductive layer,
   wherein the protective layer comprises a plurality of fillers in one layer,
   wherein an orthographic projection of an outer contour of the one layer of fillers on the base substrate surrounds an orthographic projection of the conductive layer on the base substrate, and
   wherein ones of the fillers comprise:
      an outer wall, and
      a plurality of nanoscale filling particles enclosed by the outer wall.

2. The display substrate of claim 1, wherein the fillers are at a side of the protective layer opposite the base substrate.

3. The display substrate of claim 1, wherein the fillers are inside the protective layer.

4. The display substrate of claim 1, wherein the protective layer comprises a passivation layer.

5. The display substrate of claim 1, wherein the protective layer comprises an insulating layer.

6. The display substrate of claim 1, wherein the outer wall comprises a polyurea material.

7. A display device comprising the display substrate according to claim 1.

8. A display substrate comprising:
   a base substrate,
   a conductive layer on the base substrate, and
   a protective layer on the conductive layer,
   wherein the protective layer comprises a plurality of fillers in one layer, and
   wherein ones of the fillers comprise:
      an outer wall, and
      a plurality of nanoscale filling particles enclosed by the outer wall,
   wherein at least one of the plurality of nanoscale filling particles comprises mesoporous silica with silicon nitride nanoparticles.

* * * * *